United States Patent
Pai

(10) Patent No.: US 7,176,618 B2
(45) Date of Patent: Feb. 13, 2007

(54) ORGANIC LIGHT-EMITTING DISPLAY HAVING ANTI-REFLECTIVE AND INERT CATHODE

(75) Inventor: Jui-Fen Pai, Nantou (TW)

(73) Assignee: TPO Displays Corp., Miao-Li County (TW)

( * ) Notice: Subject to any disclaimer, the term of this patent is extended or adjusted under 35 U.S.C. 154(b) by 169 days.

(21) Appl. No.: 10/463,407

(22) Filed: Jun. 18, 2003

(65) Prior Publication Data
US 2004/0201346 A1 Oct. 14, 2004

(30) Foreign Application Priority Data
Apr. 10, 2003 (TW) .............. 92108262 A

(51) Int. Cl.
H01J 1/62 (2006.01)

(52) U.S. Cl. ............ 313/506; 313/504; 313/505; 428/917

(58) Field of Classification Search ........ 313/503–512; 428/917
See application file for complete search history.

(56) References Cited

U.S. PATENT DOCUMENTS 5,049,780 A 9/1991 Dobrowolski et al. ...... 313/509
6,351,067 B2 * 2/2002 Lee et al. ............... 313/504
2001/0035713 A1 * 11/2001 Kimura .................. 313/501

FOREIGN PATENT DOCUMENTS

EP 1 164 817 A2 12/2001

OTHER PUBLICATIONS

Zhang et al., Diamondlike properties in a single phase carbon nitride solid, Appl. Phys. Lett. 68 (19(,2639 (1996).*

* cited by examiner

Primary Examiner—Nimesh Patel
Assistant Examiner—Anthony Canning
(74) Attorney, Agent, or Firm—Pillsbury Winthrop Shaw Pittman LLP

(57) ABSTRACT

An organic light-emitting display having an anti-reflective and inert cathode is provided. The cathode is made of a diamond-like carbon material to reduce ambient light reflection and increase contrast. The diamond-like carbon material is an opaque and inert material, so the cathode is anti-reflective and inert.

22 Claims, 2 Drawing Sheets

ORGANIC LIGHT-EMITTING DISPLAY HAVING ANTI-REFLECTIVE AND INERT CATHODE

CROSS REFERENCE TO RELATED APPLICATIONS

This application claims priority of Taiwan Patent Application Serial No. 092108262 filed on Apr. 10, 2003.

FIELD OF INVENTION

The present invention relates to a cathode of an organic light-emitting display and, more particularly, to an anti-reflective and inert cathode.

BACKGROUND OF THE INVENTION

The organic light-emitting display is a promising candidate for the display of the next generation. Nevertheless, elements of the organic light-emitting display reflect ambient light easily, so that the display has lower contrast and inferior performance. Additionally, the conventional cathode of the organic light-emitting display is made of Ca, Mg or LiF, which are highly active and easy to be oxidized or to react with the organic layer. Consequently, the conventional organic light-emitting display deteriorates easily and has a shorter lifespan.

Many solutions to the low contrast problem of the organic light-emitting display have been proposed in prior art, such as adhering a polarizer to the emitting side of the organic light-emitting display to improve the contrast. However, the polarizer would cut the brightness down to 30% of the original value, and then force the operation voltage to be higher to achieve target brightness, which results in shorter lifespan of the display.

Dobrowolski et al. disclosed an "Optical Interference, Electroluminescent Device having Low Reflectance" in U.S. Pat. No. 5,049,780. A semi-transparent thin metal layer, a transparent conductor layer (e.g. ITO) and a reflector layer are sequentially coated on the organic light-emitting display. Taking advantage of the light interference, the phase difference between the first and the second reflections of the ambient light is made to be 180°, and so the contrast is elevated. This method may have the brightness larger than 50% of the original value. However, this multi-layer structure is difficult to fabricate, since it requires accurate film thickness control and adopts co-evaporation process.

EPO Patent publication No. EP1164817 "Outdoor electroluminescent display device" discloses a method of coating a reflector layer on the emitting region of the outside of the display and an absorber layer on the non-emitting region, to reduce the reflection from the non-emitting region and elevate the contrast. This method losses less brightness, but requires precise pattern process. The fabrication of the organic light-emitting display cannot adopt the photolithography process, and the pattern has to be formed with metal mask instead. Therefore, this method is difficult to practice.

Besides, the above-mentioned methods only improve the contrast, but do not resolve the problems of reaction with the organic layer and the oxidation of the cathode.

SUMMARY OF THE INVENTION

One aspect of the present invention provides an anti-reflective and inert cathode, by which the problems of low contrast, reaction with the organic layer and oxidation of the cathode are resolved at the same time.

One exemplary embodiment of the present invention provides an organic light-emitting display having an anti-reflective and inert cathode. The organic light-emitting display includes a substrate, an anode, an organic light-emitting layer, a cathode and a conductor layer. The anode is formed on the substrate; the organic light-emitting layer is formed on the anode; the cathode is formed on the organic light-emitting layer; and the conductor layer is formed on the cathode. The cathode is made of a hard amorphous carbon, especially for diamond-like carbon material. The diamond-like carbon material is an opaque and inert material. Thus, the cathode is anti-reflective and inert.

Another exemplary embodiment of the present invention provides a top-emitting organic light-emitting display having an anti-reflective and inert cathode. The top-emitting organic light-emitting display includes a substrate, a conductor layer, a cathode, an organic light-emitting layer and a transparent anode. The conductor layer is formed on the substrate; the cathode is formed on the conductor layer; the organic light-emitting layer is formed on the cathode; and the transparent anode is formed on the organic light-emitting layer. The cathode is made of a hard amorphous carbon, especially for diamond-like carbon material. The diamond-like carbon material is an opaque and inert material. Thus, the cathode is anti-reflective and inert.

DETAILED DESCRIPTION

The present invention provides an organic light-emitting display having an anti-reflective and inert cathode. With this cathode, reflection of the ambient light may be reduced, and so the contrast is elevated. Besides, this cathode is not easy to oxidize or react with.

Figure 1:
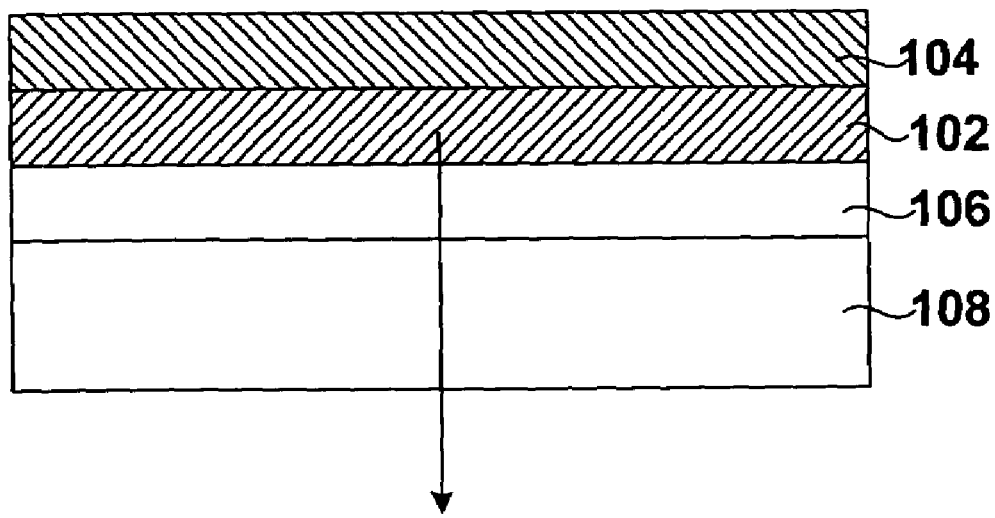
FIG. 1 is a cross-sectional diagram showing an organic light-emitting display having an anti-reflective and inert cathode of a first exemplary embodiment according to the present invention.

FIG. 1 is a cross-sectional diagram showing an organic light-emitting display having an anti-reflective and inert cathode of a first exemplary embodiment according to the present invention. This organic light-emitting display includes a substrate 108, which may be a passive matrix substrate, an active matrix substrate, a flexible substrate or of the similar kind. The anode 106 is formed on the substrate 108. The preferred material of the anode 106 is transparent indium tin oxide (ITO). The organic light-emitting layer 102 is formed on the anode 106. The material of the organic light-emitting layer 102, depending on the desirable emitting wavelength, may be molecule, polymer, fluorescence, phosphorescence or other materials.

Then the cathode 104 is formed on the organic light-emitting layer 102. The cathode 104 is made of a hard amorphous carbon, especially for diamond-like carbon material. The diamond-like carbon material is an opaque and inert material. In this embodiment, the cathode 104 is made of a diamond-like carbon material and the diamond-like carbon material is deposited to form a black layer; thus the cathode 104 is anti-reflective and inert. The diamond-like carbon material forms the cathode 104 through process of chemical vapor deposition, sputtering, laser ablation or ion beam assisted deposition. The preferred thickness of the cathode 104 is 2–300 nm. The work function of the cathode 104 is generally 0–5 eV, and a preferred value is about smaller than 4 eV.

The energy gap of the diamond-like carbon material may be modified by modifying a process parameter during the formation of the cathode 104, or by putting in dopant, such as N, P, Si or metal. Then the diamond-like carbon material could absorb ambient light with wavelengths ranging from visible to UV to meet different requirements. For example, the energy gap of the diamond-like carbon material may be modified to be 1.7–3.1 eV; in this case the material absorbs visible ambient light.

Besides, the inert cathode 104 is not easy to be oxidized or react with the organic light-emitting layer 102, so the organic light-emitting display has higher stability and longer lifespan.

Figure 2:
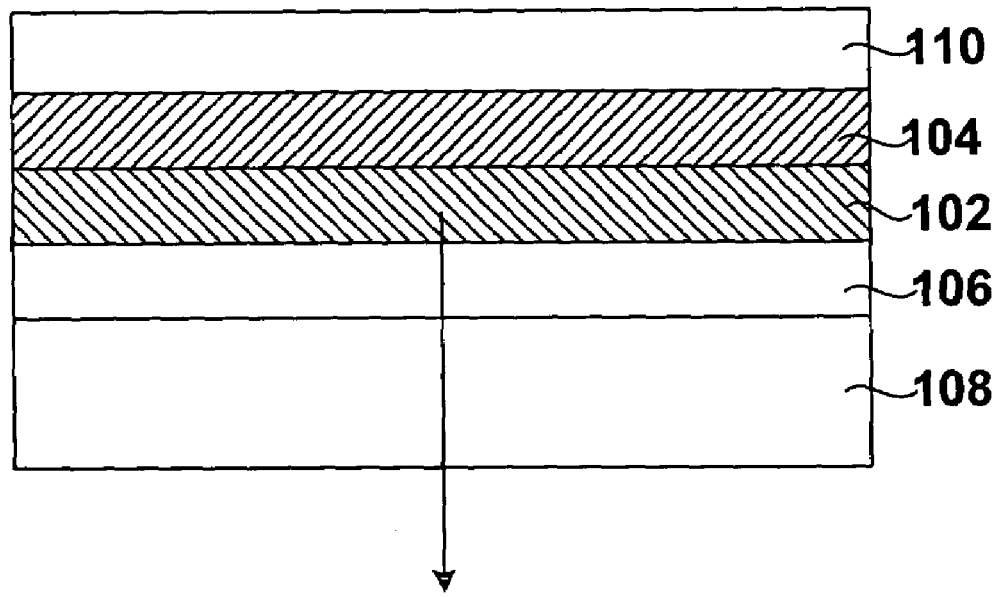
FIG. 2 is a cross-sectional diagram showing an organic light-emitting display having an anti-reflective and inert cathode of a second exemplary embodiment according to the present invention.

FIG. 2 is a cross-sectional diagram showing an organic light-emitting display of a second exemplary embodiment according to the present invention. The display in FIG. 2 is similar to that in FIG. 1. The difference from the latter lies in its conductor layer 110, which is formed on the cathode 104 to increase the electron injection efficiency of the cathode 104. The conductor layer 110 may be of aluminum or other highly conductive material.

Figure 3:
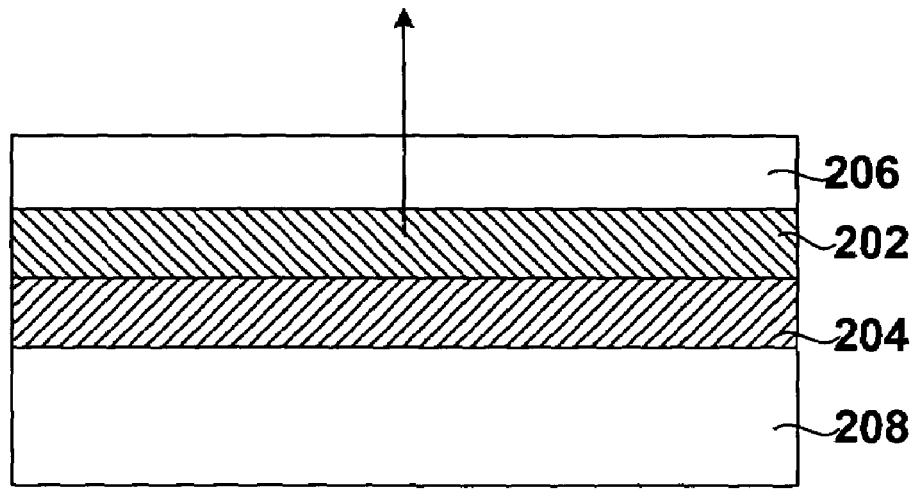
FIG. 3 is a cross-sectional diagram showing a top-emitting organic light-emitting display having an anti-reflective and inert cathode of a third exemplary embodiment according to the present invention.

FIG. 3 is a cross-sectional diagram showing an organic light-emitting display of a third exemplary embodiment according to the present invention. This organic light-emitting display is a top-emitting OLED having an inverted structure. This structure may increase the aperture ratio of the organic light-emitting display. The substrate 208 may be a passive matrix substrate, an active matrix substrate, a flexible substrate or of the similar kind. The cathode 204 is formed on the substrate 208. The cathode 204 is made of a hard amorphous carbon, especially for diamond-like carbon material. The organic light-emitting layer 202 is formed on the cathode 204. Material of the organic light-emitting layer 202 depends on the desirable emitting wavelength. The anode 206 is formed on the organic light-emitting layer 202. The preferred material of the anode 206 is transparent indium tin oxide (ITO).

In one embodiment, the cathode 204 is made of a diamond-like carbon material. The diamond-like carbon material is an opaque and inert material. Thus the cathode 204 is anti-reflective and inert. The diamond-like carbon material forms the cathode 204 through process of chemical vapor deposition, sputtering, laser ablation or ion beam assisted deposition. The preferred thickness of the cathode 204 is 2–300 nm. The work function of the cathode 204 is generally 0–5 eV, and a preferred value is about smaller than 4 eV.

The energy gap of the diamond-like carbon material may be modified by modifying a process parameter during the formation of the cathode 204, or by putting in dopant, such as N, P, Si or metal. Then the diamond-like carbon material may absorb ambient light with wavelengths ranging from visible to ULV to meet different requirements. For example, the energy gap of the diamond-like carbon material may be modified to be 1.7–3.1 eV; in this case the material absorbs visible ambient light.

Besides, the inert cathode 204 is not easy to be oxidized or react with the organic light-emitting layer 202, so the organic light-emitting display has higher stability and longer lifespan. Furthermore, a polymer organic light-emitting layer 202 is usually formed on the cathode 204 through process of spin coating or ink jet printing. Sometimes the solvent used in the process would react with the highly active cathode of the prior art, so that the display of the prior art has unstable quality or shorter lifespan. Accordingly, the inert cathode of the present invention is particularly suitable for a polymer-based top-emitting organic light-emitting display.

Figure 4:
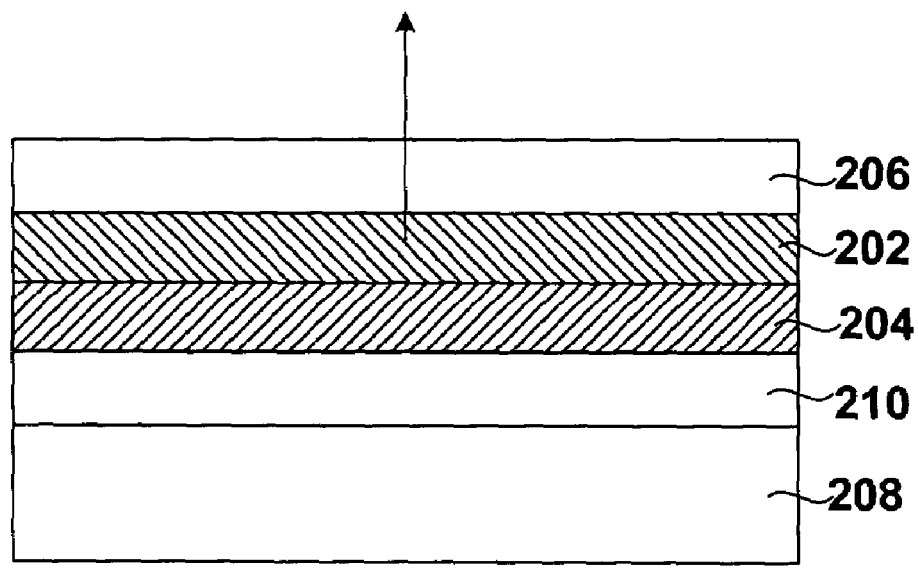
FIG. 4 is a cross-sectional diagram showing a top-emitting organic light-emitting display having an anti-reflective and inert cathode of a fourth exemplary embodiment according to the present invention.

FIG. 4 is a cross-sectional diagram showing an organic light-emitting display of a fourth exemplary embodiment according to the present invention. The display in FIG. 4 is similar to that in FIG. 3. The difference from the latter lies in its conductor layer 210, which is formed between the substrate 208 and the cathode 204 to increase the electron injection efficiency of the cathode 204. The conductor layer 210 may be of aluminum or other highly conductive material.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. An organic light-emitting display having an anti-reflective and inert cathode, comprising:
    a substrate;
    an anode formed on said substrate;
    an organic light-emitting layer formed on said anode; and
    an opaque and inert cathode formed on said organic light-emitting layer;
    wherein said cathode is made of an anti-reflective hard amorphous carbon material for absorbing ambient light.

2. The organic light-emitting display of claim 1, further comprising a conductor layer formed on said cathode.

3. The organic light-emitting display of claim 2, wherein said conductor layer is of aluminum or other highly conductive material.

4. The organic light-emitting display of claim 1, wherein a thickness of said cathode is 2–300 nm.

5. The organic light-emitting display of claim 1, wherein a work function of said cathode is smaller than about 4 eV.

6. The organic light-emitting display of claim 1, wherein said substrate is a passive matrix substrate, an active matrix substrate or a flexible substrate.

7. The organic light-emitting display of claim 1, wherein the hard amorphous carbon material includes a dopant of N, P, Si, or metal.

8. The organic light-emitting display of claim 1, wherein the hard amorphous carbon material absorbs ambient light with wavelengths ranging from visible to UV.

9. The organic light-emitting display of claim 1, wherein the energy gap of the hard amorphous carbon material is 1.7 to 3.1 eV.

10. The organic light-emitting display of claim 1, wherein the hard amorphous carbon material is black.

11. A top-emitting organic light-emitting display having an anti-reflective and inert cathode, comprising:
- a substrate;
- an opaque and inert cathode formed on said substrate;
- an organic light-emitting layer formed on said cathode; and
- an anode formed on said organic light-emitting layer;
- wherein said cathode is made of an anti-reflective hard amorphous carbon material for absorbing ambient light.

12. The top-emitting organic light-emitting display of claim 11, further comprising a conductor layer formed between said substrate and said cathode.

13. The top-emitting organic light-emitting display of claim 12, wherein said conductor layer is of aluminum or other highly conductive material.

14. The top-emitting organic light-emitting display of claim 11, wherein a thickness of said cathode is 2–300 nm.

15. The top-emitting organic light-emitting display of claim 11, wherein a work function of said cathode is smaller than about 4 eV.

16. The top-emitting organic light-emitting display of claim 11, wherein said substrate is a passive matrix substrate, an active matrix substrate or a flexible substrate.

17. The organic light-emitting display of claim 11, wherein the hard amorphous carbon material includes a dopant of N, P, Si, or metal.

18. The organic light-emitting display of claim 11, wherein the hard amorphous carbon material absorbs ambient light with wavelengths ranging from visible to UV.

19. The organic light-emitting display of claim 11, wherein the energy gap of the hard amorphous carbon material is 1.7 to 3.1 eV.

20. The organic light-emitting display of claim 11, wherein the hard amorphous carbon material is black.

21. An organic light-emitting display having an anti-reflective and inert cathode, comprising:
- a substrate;
- an anode formed on said substrate;
- an organic light-emitting layer formed on said anode; and
- an opaque and inert cathode formed on said organic light-emitting layer;
- wherein said cathode is made of an anti-reflective hard amorphous carbon material for absorbing ambient light, wherein the hard amorphous carbon material includes a dopant of N, P, Si, or metal.

22. An organic light-emitting display, comprising:
- a substrate;
- an anode formed on said substrate;
- an organic light-emitting layer formed on said anode; and
- an opaque and inert cathode formed on said organic light-emitting layer;
- wherein said cathode is made of an anti-reflective hard amorphous carbon material for absorbing ambient light, wherein the hard amorphous carbon material includes a dopant of P, Si, or metal.

* * * * *